United States Patent
Bliss et al.

[11] Patent Number: 5,543,630
[45] Date of Patent: Aug. 6, 1996

[54] HIGH TC SUPERCONDUCTING DEVICES ON BI-CRYSTAL SUBSTRATES

[75] Inventors: David F. Bliss, Arlington; Herbert E. Bates, Ashby, both of Mass.

[73] Assignee: The United States of America as represented by the Secretary of the Air Force, Washington, D.C.

[21] Appl. No.: 384,818

[22] Filed: Jan. 31, 1995

[51] Int. Cl.⁶ .......................... H01L 29/06; H01L 39/22; H01B 12/00; H01F 6/00
[52] U.S. Cl. .............................. 257/33; 257/35; 505/190; 505/234; 505/239
[58] Field of Search .................................. 257/33, 34–39; 505/190, 234, 239

[56] References Cited

U.S. PATENT DOCUMENTS

| | | | |
|---|---|---|---|
| 3,650,703 | 3/1972 | Labelle, Jr. et al. | 23/301 |
| 3,868,228 | 2/1975 | Mlavsky et al. | 23/301 SP |
| 3,915,656 | 10/1975 | Mlavsky et al. | 23/273 SP |
| 3,915,662 | 10/1975 | Labelle et al. | 23/301 SP |
| 3,953,174 | 4/1976 | LaBelle, Jr. | 23/273 SP |
| 4,028,059 | 6/1977 | LaBelle, Jr. et al. | 23/273 SP |
| 5,077,266 | 12/1991 | Takagi et al. | 257/34 |

FOREIGN PATENT DOCUMENTS

| | | | |
|---|---|---|---|
| 4-268774 | 9/1992 | Japan | 257/34 |
| 4-332180 | 11/1992 | Japan | 257/34 |

OTHER PUBLICATIONS

Char et al, "Bi–epitaxial grain boundary junctions in YBaCuO," Appl. Phys. Lett., vol. 59, No.5, Aug. 1991, pp. 733–735.

Char et al, "Propeties of epitaxial YBaCuO thin films on A1203 {1012}," Appl. Phys. Lett., Vol. 56, No. 8, Feb. 1990, pp. 785–787.

Amrein. T., et al, "Thin film $Bi_2Sr_2CaCu_2O_{8+x}$ Josephson junctions and direct current superconducting quantum interference devices on (001) $SrTiO_3$ bicrystals", Appl. Phys Lett 63 (14) 4 Oct. 1993, pp. 1978–1980.

Chalmers, Bruce, "Edge–Defined, Film–Fed Crystal Growth", Journal of Crystal Growth 13/14 (1972) pp. 84–87.

Treatise on Materials Science and Technology, vol. 8, Pande, C.S., et al "Growth, Structure, and Mechanical Behavior of Bicrystals", pp. 73–87.

*Primary Examiner*—Mahshid Saadat
*Attorney, Agent, or Firm*—Stanton E. Collier

[57] ABSTRACT

The edge-defined, film-fed growth technique process is modified to produce a thin ribbon of bi-crystalline sapphire wherein the grain boundary is an essentially straight boundary and the angle is predetermined by selective cutting of the two seeds which are placed closely together during growth. The angle selection is optimized based on the superconducting material to be deposited and the application intended. After the ribbon is pulled, the ribbon is processed by cutting an appropriate section therefrom with the grain boundary. The substrate is polished and the high Tc superconducting material is deposited thereon to produce devices which rely on weak link Josephson junctions.

4 Claims, 2 Drawing Sheets

5,543,630

HIGH TC SUPERCONDUCTING DEVICES ON BI-CRYSTAL SUBSTRATES

STATEMENT OF GOVERNMENT INTEREST

The invention described herein may be manufactured and used by or for the Government for governmental purposes without the payment of any royalty thereon.

BACKGROUND OF THE INVENTION

The present invention relates to semiconductor devices, and, in particular, relates to substrates upon which semiconductor devices are built, and, in greater particularity, relates to high Tc superconducting devices.

The edge-defined, film-fed crystal growth technique is a process used to produce thin ribbons of crystalline material and in the past has been used to produce objects of varying shapes including ribbons of sapphire. This process in the past has not been used to produce a bi-crystals of sapphire which could be used for semiconductor devices using the Josephson junction weak link. The article titled, "Edge-Defined, Film-Fed Crystal Growth" by Chalmers, Journal of Crystal Growth 13/14, (1972) 84–87 is incorporated by reference.

The following U.S. Pat. Nos. 3,650,703; 3,868,228; 3,915,656; 3,915,662; 3,953,174 and 4,028,059 are incorporated by reference as to the teaching of growing ribbons of sapphire with the above technique.

The use of bi-crystals for the use of making Josephson junctions has been reported and, in particular, a Josephson junction device may be put on a bi-crystal of $SrTiO_3$. The article titled, "Thin film $Bi_2Sr_2CaCu_2O_{8+x}$ Josephson junctions and direct current superconducting quantum interference devices on (001) $SrTiO_3$ bi-crystals," by T. Amrein et al., Appl. Phys. Lett. 63 (14) 1993, is incorporated by reference.

Thus, there exists a need for a suitable substrate for making high Tc superconducting devices such as a Josephson junction.

SUMMARY OF THE INVENTION

The present invention uses the edge-defined, film-fed growth technique for producing a thin ribbon of bi-crystalline sapphire wherein the grain boundary is an essentially straight boundary and the angle is determined by selectively cutting two seeds of different crystallographic axes but the same surface plane and placing them close together to nucleate bi-crystal growth. The bi-crystal is grown in the shape of a ribbon from a shaped die. After the ribbon is pulled, the ribbon is processed by cutting off a section of the ribbon with left and right sides divided by a grain boundary. The substrate is polished and the high $T_c$ superconducting material is deposited thereon to produce devices which rely on weak link Josephson junctions.

Therefore, one object of the present invention is to provide a substrate of bi-crystalline material having a grain boundary of controlled angle.

Another object of the present invention is to provide a substrate of bi-crystalline material such as sapphire having a grain boundary of controlled angle.

Another object of the present invention is to provide a substrate of bi-crystalline material such as sapphire having a grain boundary with an angle of at least 24 degrees.

Another object of the present invention is to provide a substrate of bi-crystalline sapphire for the deposition of high Tc superconducting devices thereon.

Another object of the present invention is to provide a substrate of bi-crystalline sapphire for the deposition of weak link Josephson junction devices thereon.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
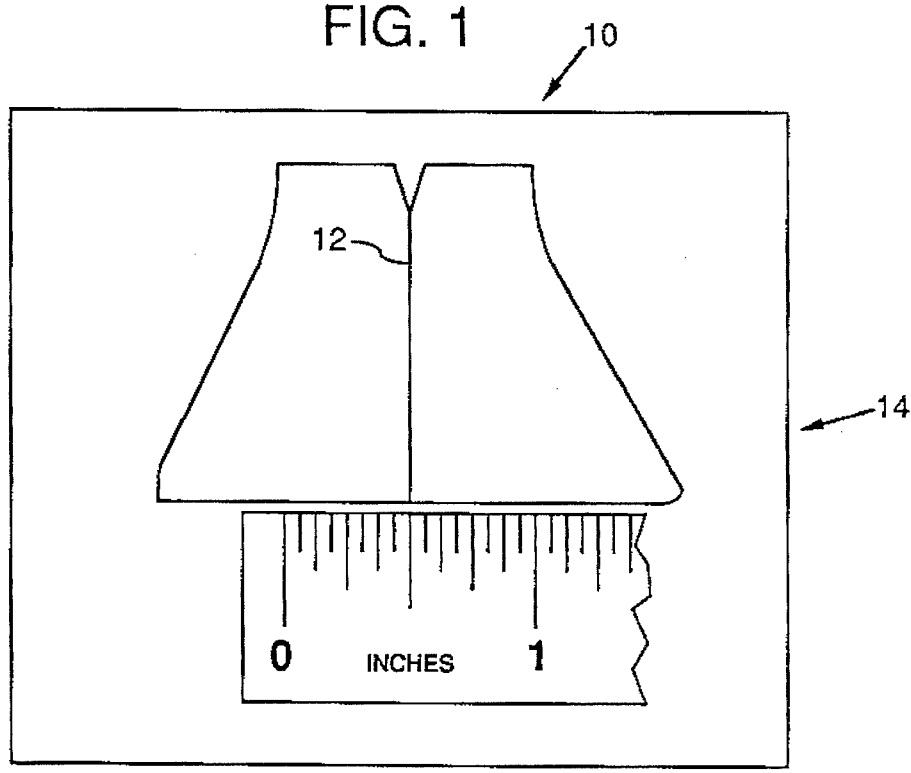
FIG. 1 is a photograph of a section of bi-crystalline ribbon of sapphire.
Figure 2:
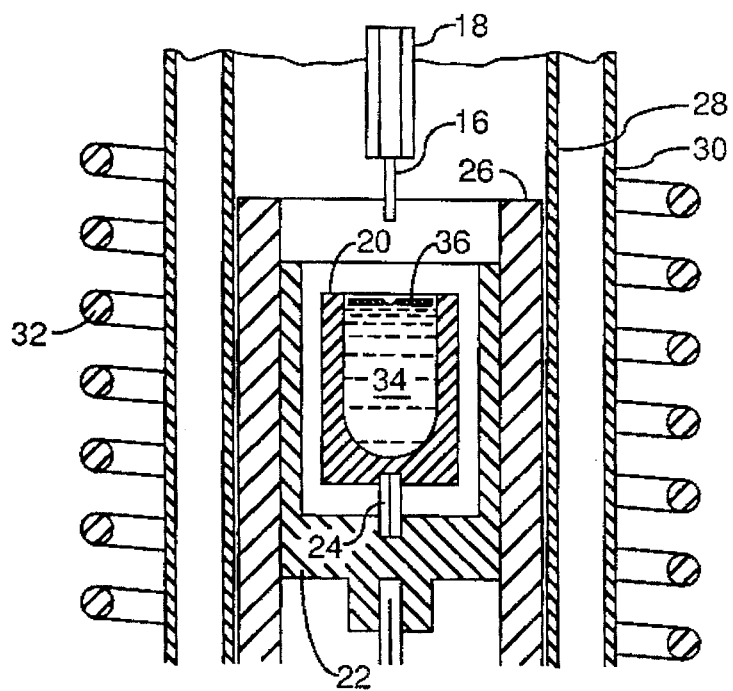
FIG. 2 is a partial view of a crystal growth furnace.
Figure 3:
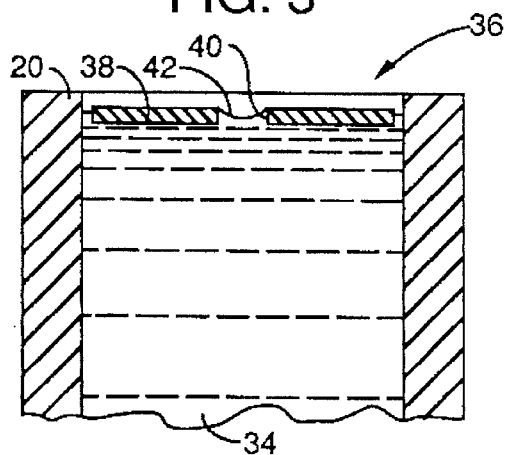
FIG. 3 is a partial view of a crucible for growing ribbons of sapphire.

Referring to FIG. 1, a bi-crystal 10 of sapphire having an essentially straight grain boundary 12 is shown by the use of contrasting light on a ribbon 14 of such. The bi-crystal 10 is grown in a conventional crystal growth furnace which is partially shown in FIG. 2 wherein a bi-crystal seed 16 is attached to a seed holder 18. A crucible 20 is mounted to a susceptor 22 by means of a rod 24. The susceptor 24 is mounted within a plurality of heat shields 26, 28 and 30 and RF coils 32 heat the susceptor 24 and crucible 20 such that a melt 34 is formed therein with a shape forming device 36 on top of the melt 34. Referring to FIG. 3, the crucible 20 has the melt 34 of alumina for forming sapphire therein. The shape forming device 36 is an orificed plate 38 having a rectangular hole 40 therethrough with a meniscus 42 therein for forming a ribbon of sapphire in a conventional manner.

Figure 4:
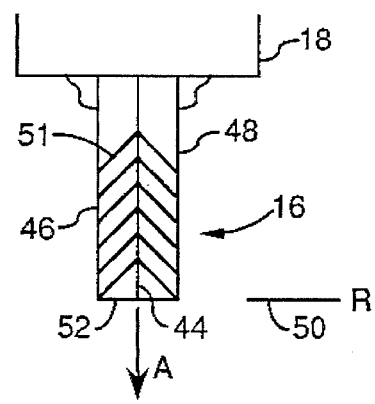
FIG. 4 is side view of a bi-crystal seed showing the A-planes therein.
Figure 5:
FIG. 5 is a bottom end view of the bi-crystal seed showing the R-planes.
Figure 7:
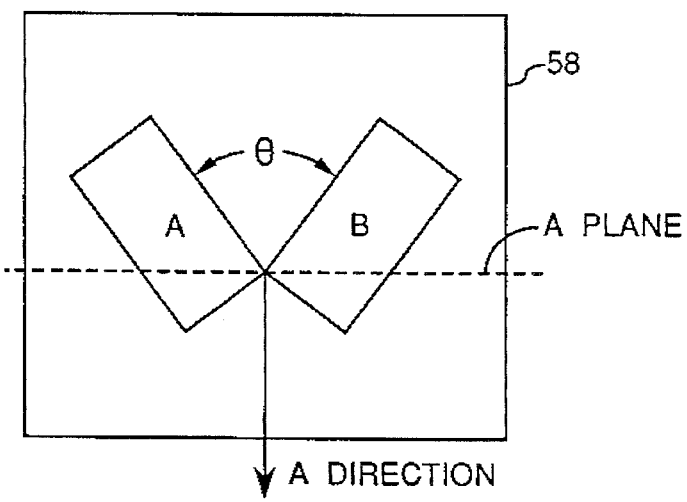
FIG. 7 illustrates a R-plane sapphire plate where two seeds are cut therefrom in relation to each other.

In order to form the bi-crystal 14, a unique bi-crystal seed 16, FIG. 4, is attached to the seed holder 18. As seen therein, a grain boundary 44 is formed between the two seeds 46 and 48 with the A-planes 51 indicated thereon. A bottom end view of the bi-crystal seed 16 is shown in FIG. 5 wherein the parallel R-planes are shown. The manner of cutting the two seeds is shown in FIG. 7 wherein a R-plane sapphire plate 58 is shown by top view. Two seeds, A and B, having an angle alpha between them which must be at least 24 degrees for sapphire for the application to high Tc superconducting devices. The A direction on the plate 58 is parallel to the plate 58 and the A-planes are perpendicular to the plate 58.

The EFG process using the crystal growth furnace shown hereinabove was modified to produce a bi-crystal 14 from two uniquely oriented seed crystals 46 and 48. The bi-crystal ribbon contains two parallel grains running the length of the ribbon and separated by the grain boundary 12. The seeds are cut so that any angle can be produced at the grain boundary, and, further, allowing the ribbon to remain flat. Typical dimensions of the ribbon are 0.050 inch thick by 1 inch wide by 12 inches longs. Other dimensions are clearly possible. The EFG process has only been used in the past to produce single oriented objects. In the present invention, a bi-crystal seed 16 comprises two seeds attached in parallel each with a unique crystallographic orientation. The seeds must be cut so that the same crystal surface plane (in this case, the R-plane 50) is exposed at the surface of the bi-crystal seed 16 bottom 52, but the crystallographic axes are different. For superconducting oxide material to grow on this material, the differences in the axes must be at least 24 degrees apart in order to produce weak link Josephson junction devices. The critical density in these devices has been shown to be dependent on the angle between the two axes in a strontium titanate bi-crystal. The seeds must also be cut symmetrically about the A-axis in order to grow long (4 inches to 12 inches) bi-crystals. Because different crystallographic directions have different growth rates, the seeds must be chosen so that the two axes will have equivalent growth rates. If the seeds are not oriented symmetrically, then one grain will grow at the expense of the other, and the grain boundary will not run parallel to the growth direction. In such a case the ribbon will be a single crystal which has no use in this application. By choosing seeds which are symmetrically oriented about the A-axis, bi-crystal ribbons can be grown with any grain boundary angle between 24 degrees to 90 degrees.

After the bi-crystal ribbon is formed, substrates are cut from the ribbon with the grain boundary therein and processed in a conventional manner for the deposition of high $T_c$ superconducting material thereon.

Figure 6:
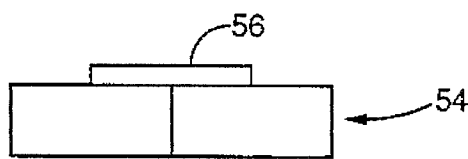
FIG. 6 is a substrate for deposition of electronic devices.

With the ability to adjust the grain boundary angle, a substrate 54, FIG. 6, cut from the ribbon will provide means to optimize the performance of high $T_c$ Josephson junctions 56 for high speed microwave signal generators and amplifiers, for example.

Clearly, many modifications and variations of the present invention are possible in light of the above teachings and it is therefore understood, that within the inventive scope of the inventive concept, the invention may be practiced otherwise than specifically claimed.

What is claimed is:

1. A bi-crystal seed of sapphire, said bi-crystal seed comprising:

a first crystal seed, said first crystal seed being cut to have a crystallographic axis at a predetermined angle from a first side, and a second crystal seed, said first crystal seed being cut to have a crystallographic axis at a predetermined angle from a first side;

whereby said first and said second crystal seeds are attached during growth together at their first sides wherein the angle between said crystallographic axes is at least 24 degrees and an r-plane is exposed on a face of said seed.

2. A bi-crystal ribbon of sapphire, said bi-crystal ribbon comprising:

a first crystal section; and a second crystal section;

whereby a crystal grain boundary is produced between said sections and is essentially straight, said sections having symmetrical crystallographic axes which are predeteremined by a bi-crystal seed used in the edge-defined, film-fed growth process to produce said bi-crystal ribbon, an angle between said crystallographic axes in said sections ranges from 24 to 90 degrees and an r-plane exposed on a face of said ribbon.

3. A bi-crystal substrate of sapphire for the deposition thereon of a high Tc superconducting devices, said substrate comprising:

a first bi-crystalline section having a polished surface thereon; and a second bi-crystalline section having a polished surface thereon, said second bi-crystalline section being integrally attached during growth to said first bi-crystalline section along a straight grain boundary, said polished surfaces forming a single polished surface, said first and said second bi-crystalline sections having predetermined crystallographic axes symmetrical to the grain boundary and separated by an angle ranging from about 24 to 90 degrees, said substrate having an r-plane exposed on said single polished surface.

4. A bi-crystal substrate as defined in claim 3 further including weak link Josephson junctions devices thereon wherein a weak link occurs across said grain boundary.

* * * * *